(12) United States Patent
Rowell

(10) Patent No.: US 10,969,427 B2
(45) Date of Patent: Apr. 6, 2021

(54) MEASUREMENT SYSTEM AND METHOD FOR MULTIPLE ANTENNA MEASUREMENTS WITH DIFFERENT ANGLES OF ARRIVAL

(71) Applicant: Rohde & Schwarz GmbH & Co. KG, Munich (DE)

(72) Inventor: Corbett Rowell, Munich (DE)

(73) Assignee: Rohde & Schwarz GmbH & Co. KG, Munich (DE)

(*) Notice: Subject to any disclaimer, the term of this patent is extended or adjusted under 35 U.S.C. 154(b) by 234 days.

(21) Appl. No.: 16/239,158

(22) Filed: Jan. 3, 2019

(65) Prior Publication Data

US 2020/0217885 A1 Jul. 9, 2020

(51) Int. Cl.
| | |
|---|---|
| *G01R 31/302* | (2006.01) |
| *H01Q 15/14* | (2006.01) |
| *G01R 1/04* | (2006.01) |
| *G01R 31/28* | (2006.01) |
| *G01R 31/303* | (2006.01) |
| *G01R 31/311* | (2006.01) |

(52) U.S. Cl.
CPC ........... *G01R 31/3025* (2013.01); *G01R 1/04* (2013.01); *G01R 31/2822* (2013.01); *G01R 31/303* (2013.01); *G01R 31/311* (2013.01); *H01Q 15/14* (2013.01); *H01L 2224/48227* (2013.01); *H01L 2224/73265* (2013.01); *H01L 2924/00* (2013.01); *H01L 2924/0002* (2013.01)

(58) Field of Classification Search
CPC ......... H01L 2924/00; H01L 2924/0002; H01L 2224/48227; H01L 2224/73265; G01R 31/3025; G01R 31/2822; G01R 31/303; G01R 31/311; G01R 1/04; G01R 29/0871; H01Q 15/14
See application file for complete search history.

(56) References Cited

U.S. PATENT DOCUMENTS

| | | | |
|---|---|---|---|
| 2018/0006745 A1 | 1/2018 | Vanwiggeren | |
| 2019/0036621 A1* | 1/2019 | Vanwiggeren | ....... H04B 17/354 |
| 2019/0162780 A1* | 5/2019 | Danz | .................. G01R 31/2841 |
| 2020/0007245 A1* | 1/2020 | Abadie | ................ G01R 29/105 |

FOREIGN PATENT DOCUMENTS

CN 102571235 B 7/2012

* cited by examiner

*Primary Examiner* — Raul J Rios Russo
(74) *Attorney, Agent, or Firm* — DITTHAVONG, STEINER & MLOTKOWSKi

(57) ABSTRACT

A measurement system and method for over the air multiple antennas measurements are provided. The measurement system comprises, inside an anechoic chamber, a device under test, several measurement antennas, several mirrors and at least one shaped reflector. The measurement antennas are placed pointing at the shaped reflector. Each of the mirrors is placed along fields reflected by the shaped reflector. The mirrors reflect fields that form different angles of arrival at the device under test.

20 Claims, 7 Drawing Sheets

MEASUREMENT SYSTEM AND METHOD FOR MULTIPLE ANTENNA MEASUREMENTS WITH DIFFERENT ANGLES OF ARRIVAL

TECHNICAL FIELD

The invention relates to a measurement system and a measurement method for multiple antenna measurements in the far-field regime, within a compact antenna test range reflector chamber.

BACKGROUND OF THE INVENTION

The rapidly evolving field of wireless communications employing multiple antennas, such as Multiple-Input Multiple-Output (MIMO) systems, is generating an enormous amount of wireless applications, demanding for versatile measurement systems and measurement methods to verify the correct performance of said technologies in a practical, highly efficient and accurate manner, primarily with regard to their far-field characteristics.

US 2018/0006745 A1 discloses a system for characterizing a device under test (DUT) including an integrated antenna array. In particular, the system includes an optical subsystem with first and second focal planes, and the integrated antenna array is positioned substantially on the first focal plane of the optical subsystem. The system also includes a measurement array having one or more array elements positioned substantially on the second focal plane of the optical subsystem. The measurement array is configured to receive signals transmitted from the integrated antenna array via the optical subsystem. A far-field radiation pattern of the integrated antenna array is created at the measurement array, enabling measurements of DUT parameters at each array element of the one or more array elements in the measurement array.

It is noted, nevertheless, that said prior art document does not envisage radiation at the DUT having several different angles of arrival, neglecting the possible dynamical changing behavior of the antennas during operation, and then limiting the accuracy and functionality of the testing method and device.

Thus, there is a need for a system and a method enabling investigating a device under test within a wireless environment with multiple antennas inside a compact antenna test range reflector chamber, in an efficient manner whereby the tests performed comprise radiation to arrive at the DUT with different angles of arrival.

SUMMARY OF THE INVENTION

Embodiments of the present disclosure provide, according to the first aspect of the invention, a measurement system comprising inside an anechoic chamber: a device under test, several measurement antennas, several mirrors, and at least one shaped reflector. The measurement antennas are placed pointing at the shaped reflector. Further, there are several mirrors placed along fields created by the shaped reflector wherein the mirrors reflect fields that form different angles of arrival at the device under test. Advantageously, fast switching of angles of arrival at the device under test can be achieved, thereby ensuring a realistic measurement with high accuracy. Further advantageously, the use of the reflector allows for creating large quiet zones, reducing the required measurement space.

According to a first preferred implementation form of the first aspect of the invention, each of the several measurement antennas is a feed antenna. In addition to this or as an alternative, the shaped reflector corresponds to a compact antenna test range reflector. Moreover, the anechoic chamber is a shielded anechoic chamber which additionally or alternatively is of cuboid shape. Advantageously, measurement accuracy and measurement efficiency can be enhanced. Further advantageously, complexity can further be reduced.

According to a second preferred implementation form of the first aspect of the invention, the measurement antennas are set at different angles whereby the measurement antennas pointing at the shaped reflector are at an offset distance from the focal point of the shaped reflector. In addition to this, or as an alternative, the field generated by each of the measurement antennas pointing at the reflector is off center. Advantageously, for instance, measurement efficiency can further be increased.

According to a further preferred implementation form of the first aspect of the invention, the measurement system further comprises a device under test positioner configured to move the device under test in all three dimensions. Advantageously, this allows performing measurements in different positions.

According to a further preferred implementation form of the first aspect of the invention, at least one of the mirrors, preferably each of the mirrors, is segmented into multiple small mirrors in order to simulate the spread or clustering of energy inside the angle of arrival at the device under test. Advantageously, scattering effects can be simulated in a highly efficient and accurate manner.

According to a further preferred implementation form of the first aspect of the invention, the mirrors have different size, or alternatively are positioned at a different angles, to create different quiet zone sizes. Advantageously, efficiency and accuracy can be increased.

According to a further preferred implementation form of the first aspect of the invention, some of the mirrors are combined into a single mirror, whereby each section of the single mirror reflects a field creating multiple angles of arrival at the device under test. Advantageously, this allows to simulating several testing conditions.

According to a further preferred implementation form of the first aspect of the invention, the measurement antennas are part of an antenna array. In addition, the antenna array is configured to generate a number of M beams in multiple angles, wherein the number M of beams is greater than, or equal to, or smaller than the number N of measurement antennas. Advantageously, this enables simulating a variety of environmental conditions related to the incoming signal. Further advantageously, this also allow for switching between several angles of arrival.

According to a further preferred implementation form of the first aspect of the invention, at least one of the mirrors, preferably each of the mirrors, is manually or automatically removable from the anechoic chamber through an aperture arranged in one of the walls of the chamber. In addition to this, or as an alternative, at least one of the mirrors, preferably each of the mirrors, is movably arranged in the anechoic chamber in a way that the mirror is activated or deactivated by being tilted manually or automatically by a tilt mechanism, especially downwards its back surface wherein the back surface of each of the mirrors is covered with an absorber material. Advantageously, this allows to modify the testing conditions in a systematic manner, enhancing efficiency. Further advantageously, complexity can be reduced, which also leads to an increased efficiency.

According to a second aspect of the invention, a measurement method is provided. The measurement method comprises the steps of placing, inside an anechoic chamber, each of several measurement antennas pointing at a shaped reflector. The method further comprises placing, inside the anechoic chamber, several mirrors along several fields reflected by the shaped reflector, wherein the mirrors reflect several fields that form different angles of arrival at a device under test. Advantageously, fast switching of angles of arrival at the device under test can be achieved, thereby ensuring a realistic measurement with high accuracy. Further advantageously, this allows to create large quiet zones, reducing the required measurement space.

According to a first preferred implementation form of the second aspect of the invention, each of the several measurement antennas is formed to be a feed antenna. In addition to this or as an alternative, the shaped reflector corresponds to a compact antenna test range reflector. Moreover, the anechoic chamber is formed as a shielded anechoic chamber which additionally or alternatively is formed as cuboid shaped. Advantageously, measurement accuracy and measurement efficiency can be enhanced. Further advantageously, complexity can also be reduced.

According to a second preferred implementation form of the second aspect of the invention, the measurement method further comprises placing each of the measurement antennas pointing at the shaped reflector and at an offset distance from the focal point of the shaped reflector. In addition to this, or as an alternative, the field generated by each of the measurement antennas pointing at the reflector is arranged to be off center. Advantageously, for instance, measurement efficiency can further be increased.

According to a further preferred implementation form of the second aspect of the invention, the measurement method further comprises the step of moving the device under test in all three dimensions by using a device under test positioner. Advantageously, this allows performing measurements in different positions.

According to a further preferred implementation form of the second aspect of the invention, the measurement method further comprises the step of segmenting at least one of the mirrors, preferably each of the mirrors, into multiple small mirrors to simulate the spread or clustering of energy inside the angle of arrival at the device under test. Advantageously, scattering effects can be simulated in a highly efficient and accurate manner.

According to a further preferred implementation form of the second aspect of the invention, the mirrors have different size, or alternatively are positioned at a different angles, to create different quiet zone sizes. Advantageously, efficiency and accuracy can be increased.

According to a further preferred implementation form of the second aspect of the invention, the measurement method further comprises that some of the mirrors are combined into a single mirror, whereby each section of the single mirror reflects a field creating multiple angles of arrival at the device under test. Advantageously, this allows to simulating several testing conditions.

According to a further preferred implementation form of the second aspect of the invention, the measurement method further comprises that the measurement antennas are formed to be part of an antenna array. In addition, the antenna array is configured to generate a number of M beams in multiple angles, wherein the number M of beams is greater than, or equal to, or smaller than the number N of measurement antennas. Advantageously, this enables simulating a variety of environmental conditions related to the incoming signal. Further advantageously, this also allow for switching between several angles of arrival.

According to a further preferred implementation form of the second aspect of the invention, the measurement method further comprises the step of removing at least one of the mirrors, preferably each of the mirrors, from the anechoic chamber, manually or automatically, through an aperture arranged in one of the walls of the chamber. Additionally or alternatively, the step of movably arranging at least one of the mirrors, preferably each of the mirrors, inside the anechoic chamber in a way that the mirror is activated or deactivated by being tilted manually or automatically by a tilt mechanism, especially downwards its back surface, wherein the back surface of each of the mirrors is covered with an absorber material, is also comprised. Advantageously, this allows to modify the testing conditions in a systematic manner, enhancing efficiency. Further advantageously, complexity can be reduced, which also leads to an increased efficiency.

BRIEF DESCRIPTION OF THE DRAWINGS

Illustrative embodiments of the invention are now further explained by way of example only, and not for limitation, with respect to the drawings in which like reference numerals refer to similar elements. It is emphasized that the various features are not necessarily drawn to scale. In the drawings.

DETAILED DESCRIPTION OF THE INVENTION

Figure 1:
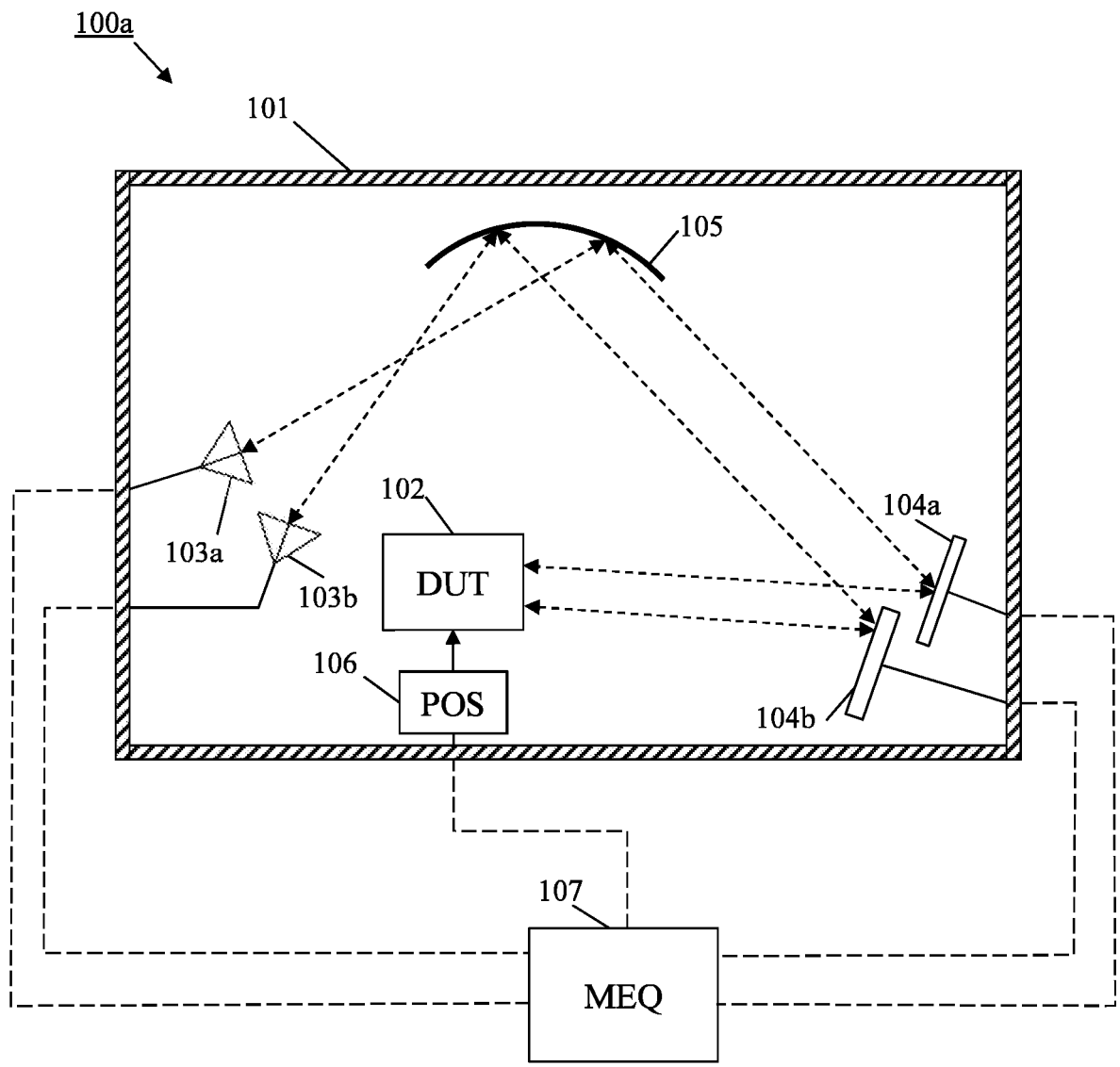
FIG. 1 shows a simplified cross-sectional view of a measuring system for analyzing a DUT with several antennas, several mirrors and at least one shaped reflector, inside an anechoic chamber, according to a first embodiment.

Firstly, FIG. 1 depicts an exemplary embodiment of an inventive measurement system 100a. The measurement system 100a comprises, inside an anechoic chamber 101, a device under test 102, several measurement antennas, exemplarily two measurement antennas 103a, 103b, several mirrors, exemplarily two mirrors 104a, 104b, at least one shaped reflector 105, and a positioner 106 for positioning the device under test 101.

In this exemplary case, each of the measurement antennas 103a, 103b is also a feed antenna. Furthermore, the shaped reflector 105 corresponds to a compact antenna test range reflector. In this context, it should be mentioned that if one of the several antennas corresponds to the normal compact antenna test range feed (CATR) antenna located at the focal point of the reflector, then the number of measurement antennas is the total number of antennas N but one, where N is a natural number, whereas if there is not a feed antenna located at the focal point of the reflector, then the number of measurement antennas is equal to the total number of antennas N.

Moreover, with respect to FIG. 1, it is noted that the anechoic chamber 101 is a shielded anechoic chamber. In addition to this, or alternatively, the anechoic chamber 101 is cuboid shaped.

Inside the anechoic chamber 101 the measurement antennas 103a, 103b are set at different angles whereby the measurement antennas 103a, 103b pointing at the shaped reflector 105 are at an offset distance from the focal point of the shaped reflector 105. It should be mentioned that the offset position for the antennas is any position apart from the position of the focal point. Moreover, the field generated by each of the measurement antennas 103a, 103b is pointing at the shaped reflector 105 and is off center.

Furthermore, as it can be seen from FIG. 1, each of the mirrors 104a, 104b is placed along fields reflected by the shaped reflector 105, and the mirrors 104a, 104b reflect fields that form different angles of arrival at the device under test 102.

In this context, it is noted that each of the measurement antennas 103a, 103b radiates spherical waves towards the shaped reflector 105, which in turn reflects plane waves towards an associated mirror 104a, 104b, placed out of the quiet zone of the device under test. Moreover, each mirror 104a, 104b is associated to a specific antenna 103a, 103b. In addition to this, each mirror 104a, 104b can also receive radiation scattered from the remaining measurement antennas.

In the context of the invention it is understood that the term mirror refers to a reflecting structure. In this context, each of the mirrors 104a, 104b can preferably be constructed using a glass surface. Alternatively, each of the mirrors 104a, 104b can preferably be constructed employing a metal surface, exemplary an aluminum surface or a silver surface.

With respect to this exemplary embodiment, it should be mentioned that the positioner 106 is configured to move the device under test 102 in all three dimensions in order to accommodate the multiple signals from the several mirrors, allowing measurements in different positions.

Moreover, it can be noted from FIG. 1 that the inventive measurement system 100a further comprises a measurement equipment 107, which is configured to characterize the device under test 102 with respect to the radiation incident at several angles of arrival.

Figure 2:
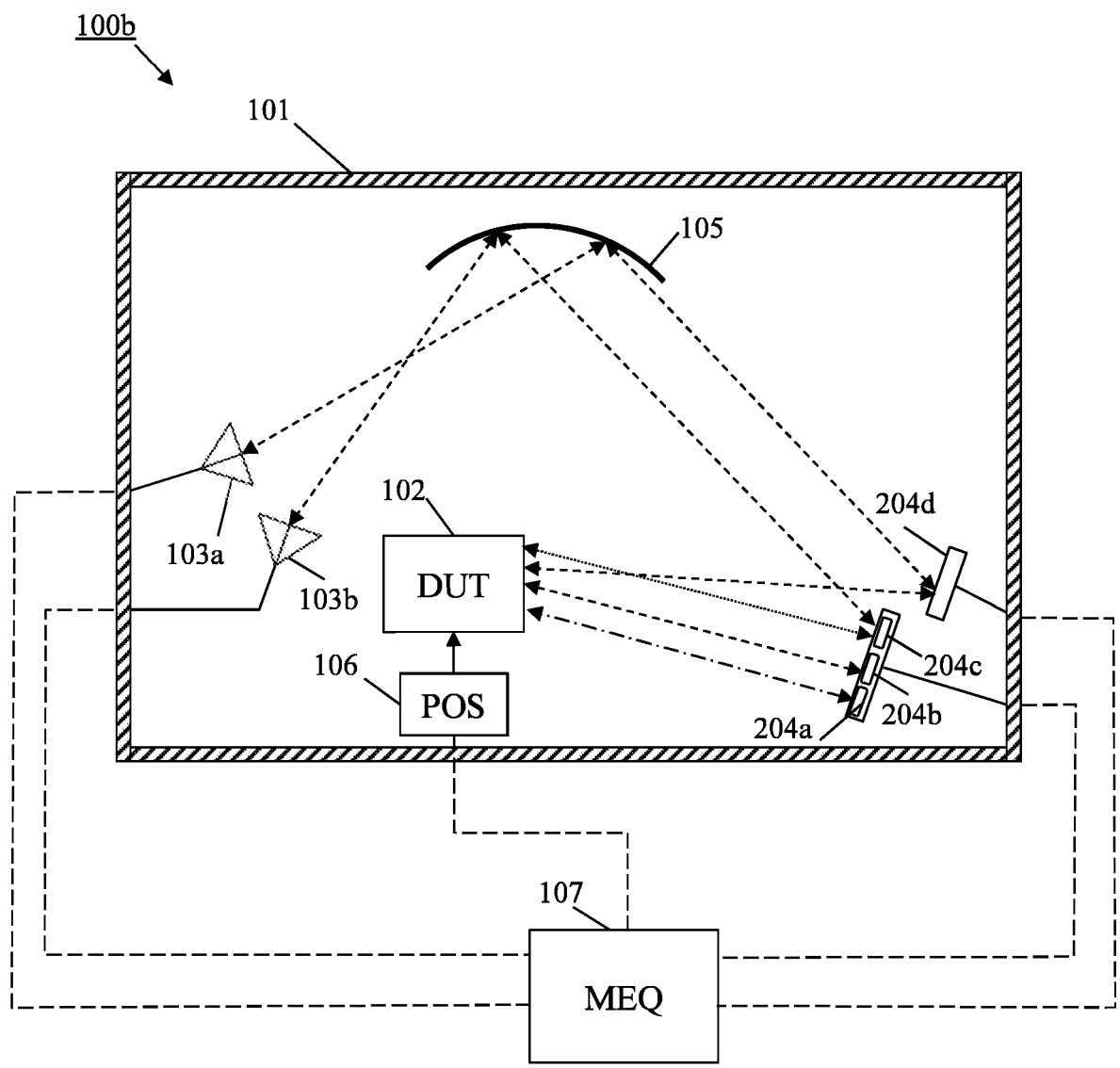
FIG. 2 shows a second embodiment of a measuring system for analyzing a DUT with several antennas, several mirrors and at least one shaped reflector, inside an anechoic chamber, in accordance with the present invention.

FIG. 2 depicts a second exemplary embodiment of the inventive measurement system 100b, in which at least one of the mirrors, preferably each of the mirrors, is segmented into multiple small mirrors, exemplary mirrors 204a, 204b, 204c, in order to simulate the spread or clustering of energy inside the angle of arrival at the device under test. In this context, it is emphasized that a signal is transmitted from an antenna 103a, 103b towards the reflector 105, which in turn reflects it towards a segmented mirror, and from the mirror to the device under test 102. Thus, the signal arrives at the device under test 102 in a scattered manner.

Moreover, as shown in FIG. 2, the mirrors can be arranged to have different size, as in the exemplary mirror 204d, or alternatively are positioned at a different angles, in order to create different quiet zone sizes.

In the context of this embodiment, by way of example, the measuring system 100b comprises a set of five measurement antennas which are used to create five different angles of arrival. Two measurement antennas are excited at a time in order to perform Radio Resource Management (RRM) measurements. This enables to perform, for instance, simulation of hand-over, 3GPP communications or fading.

By way of further example, the inventive measurement system 100b comprises a set of M measurement antennas, where M is a natural number that can be equal to or smaller than the total number of mirrors inside the anechoic chamber. The M antennas are simultaneously excited in order to measure the maximum throughput at the device under test.

Figure 3:
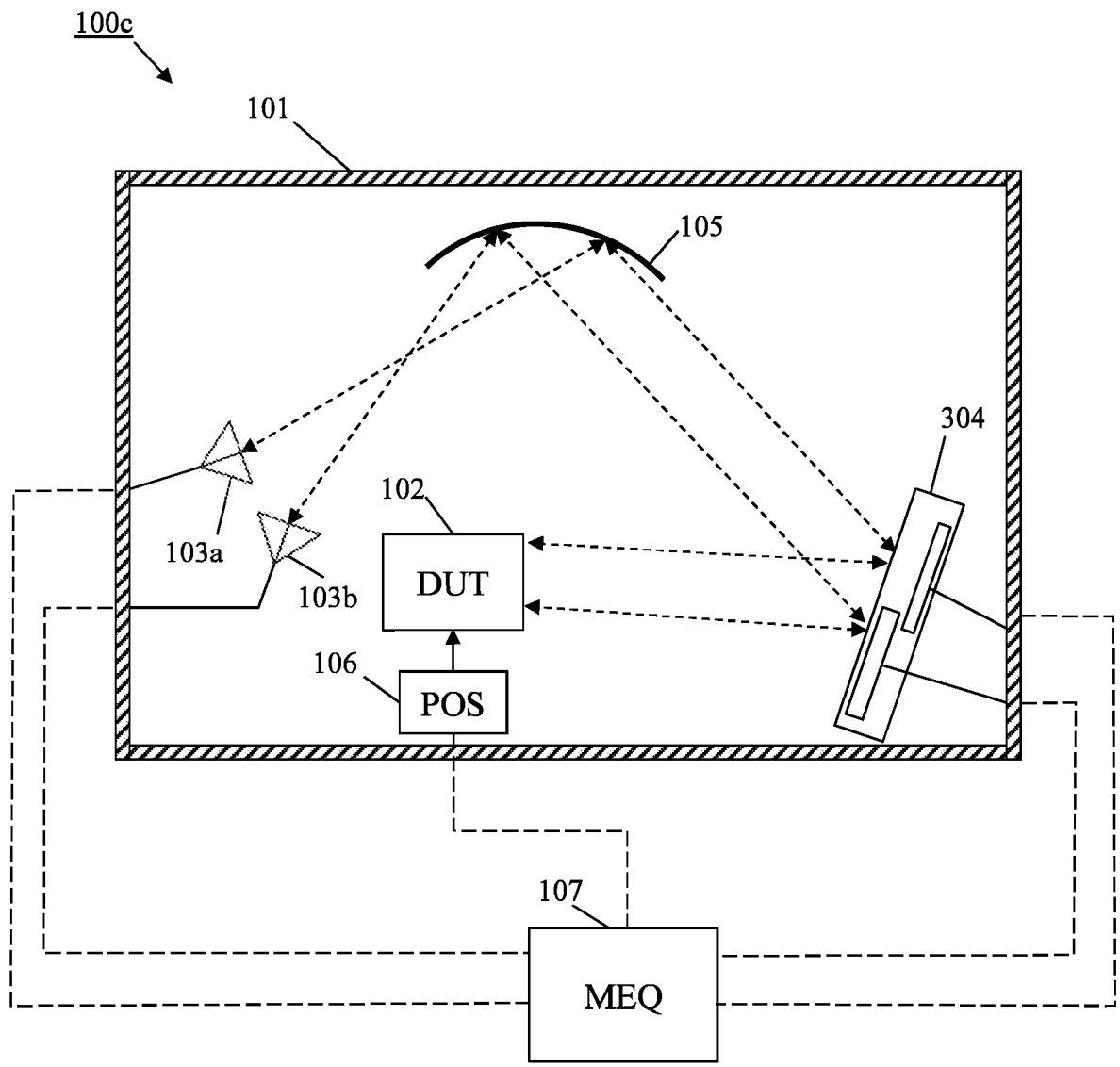
FIG. 3 shows a third embodiment of a measuring system for analyzing a DUT with several antennas, several mirrors and at least one shaped reflector, inside an anechoic chamber, in accordance with the present invention.

With special respect to the mirrors, FIG. 3 illustrates a third exemplary embodiment 100c of the inventive measurement system. Said embodiment further comprises that some of the mirrors are combined into a single mirror, exemplarily the mirror 304, whereby each section of the single mirror 304 reflects a field creating multiple angles of arrival at the device under test. In this context, it should be mentioned that the single mirror 304 can be arranged to have different shapes, for instance a torus shape, a sectioned doughnut shape or an ellipsoidal shape.

Figure 4:
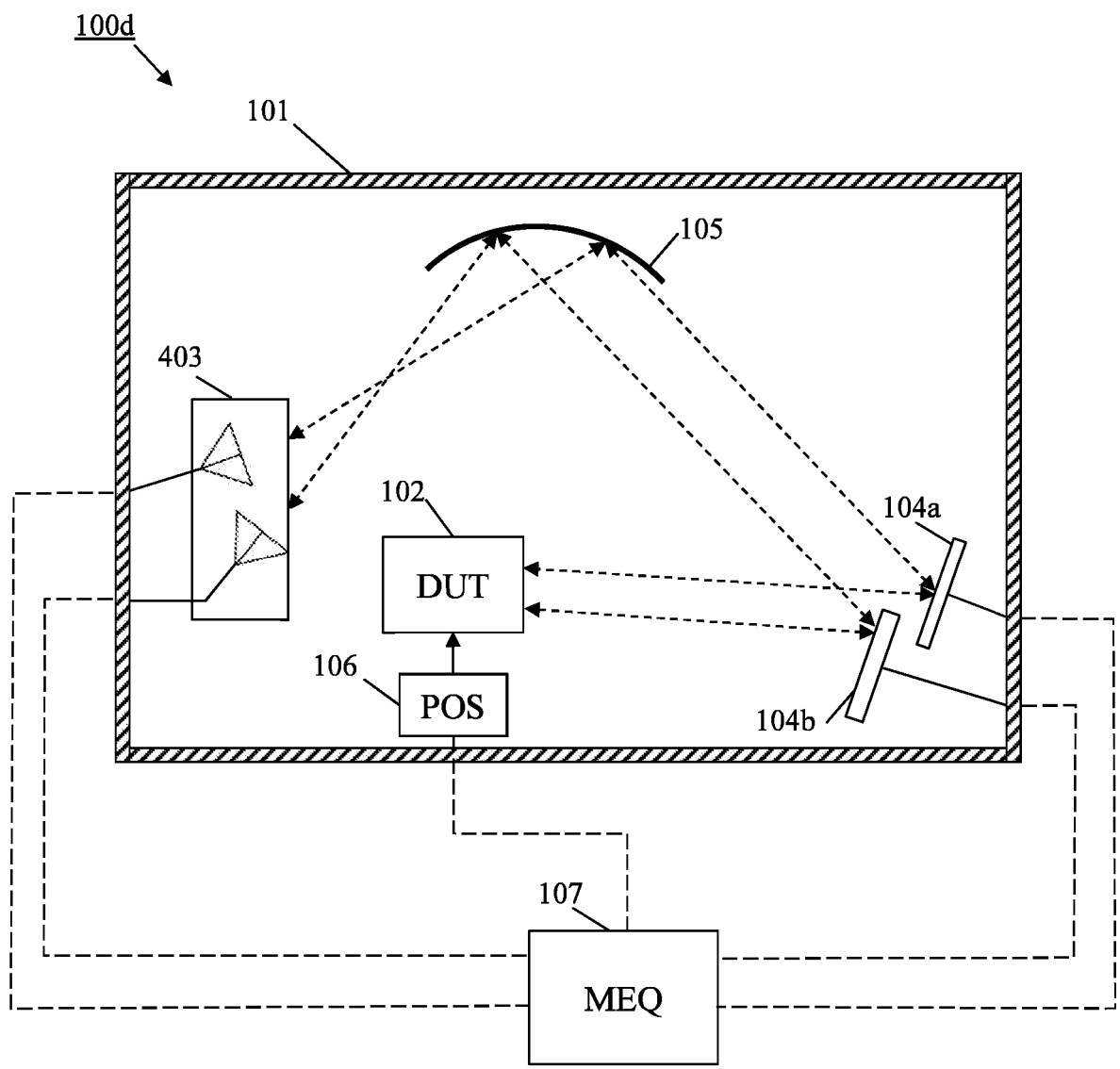
FIG. 4 shows a fourth embodiment of a measuring system for analyzing a DUT with several antennas, several mirrors and at least one shaped reflector, inside an anechoic chamber, in accordance with the present invention.

A further exemplary embodiment 100d of the inventive measurement system is depicted in FIG. 4. Said measurement system 100d further comprises that the measurement antennas are part of an antenna array 403. Moreover, the antenna array 403 is configured to generate a number of M beams in multiple angles, in which the number M of beams is greater than, or equal to, or smaller than the number N of measurement antennas, where N is a natural number corresponding to the total quantity of several antennas placed inside the anechoic chamber.

Figure 5:
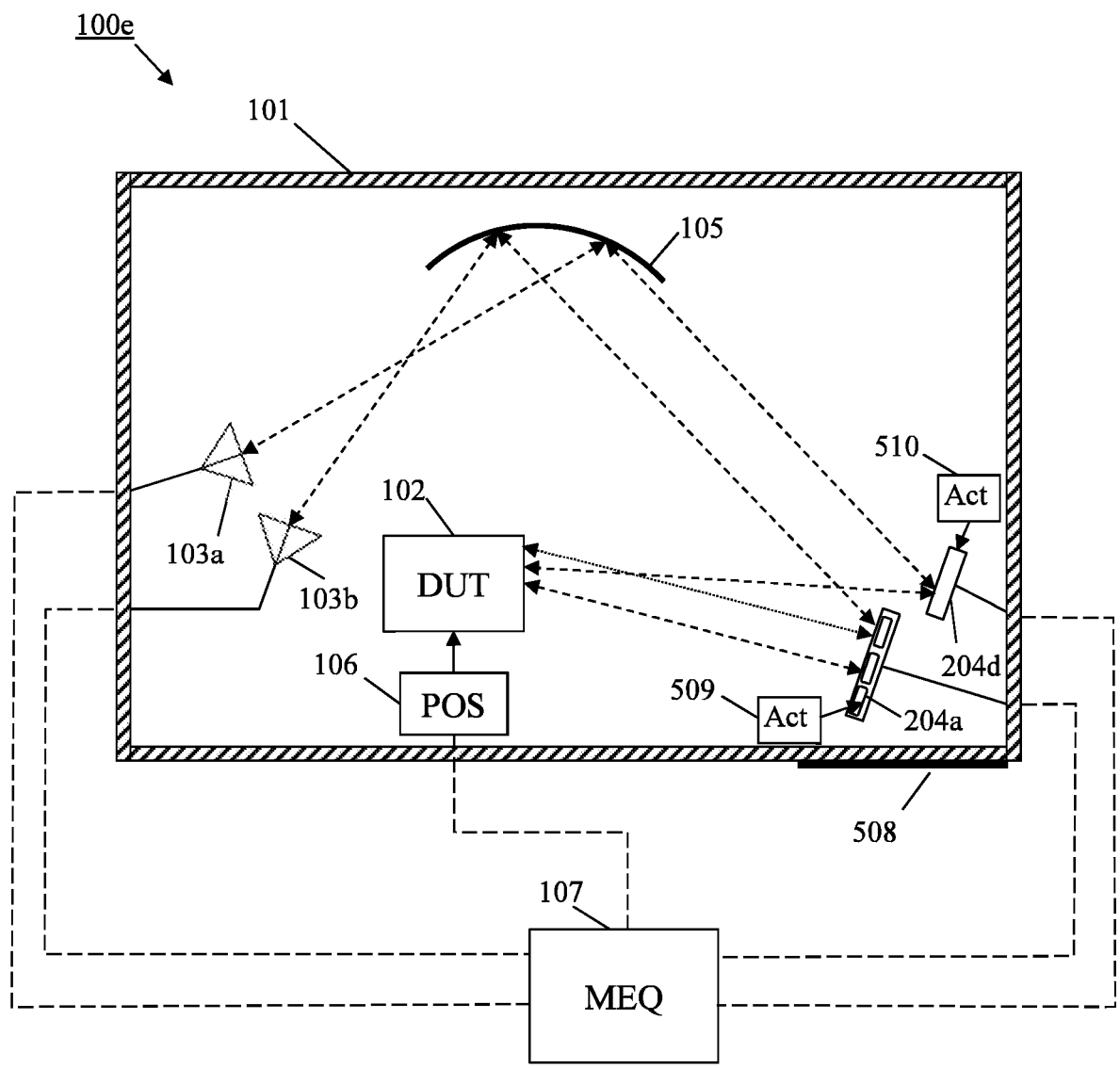
FIG. 5 shows a fifth embodiment of a measuring system for analyzing a DUT with several antennas, several mirrors and at least one shaped reflector, inside an anechoic chamber, in accordance with the present invention.

Moreover, FIG. 5 shows a further exemplary embodiment of the advantageous measurement system 100e, wherein at least one of the mirrors, preferably each of the mirrors 104a, 104b, is manually or automatically removable from the anechoic chamber 101. The removal is accomplished through an aperture 508 arranged in one of the walls of the anechoic chamber 101.

In addition to this or as an alternative, at least one of the mirrors, preferably each of the mirrors 104a, 104b, 204a, 204b, 204c, 204d, is movably arranged in the chamber 101 in a way that the mirror is activated or deactivated by being tilted, manually or automatically by a tilt mechanism, especially downwards its back surface, wherein the back surface of each of the mirrors 104a, 104b, 204a, 204b, 204c, 204d is covered with an absorber material.

In this context, it is mentioned that deactivation of each mirror 104a, 104b, 204a, 204b, 204c, 204d can also be achieved by tilting the mirror in such a way that the radiation reflected by said mirror does not reach the device under test 102 but one of the shielded walls of the anechoic chamber 101.

Moreover, the tilting mechanism moving the mirrors 104a, 104b, 204a, 204b, 204c, 204d can be achieved by using, for instance, actuators, as the exemplarily actuators 509, 510.

Figure 6:
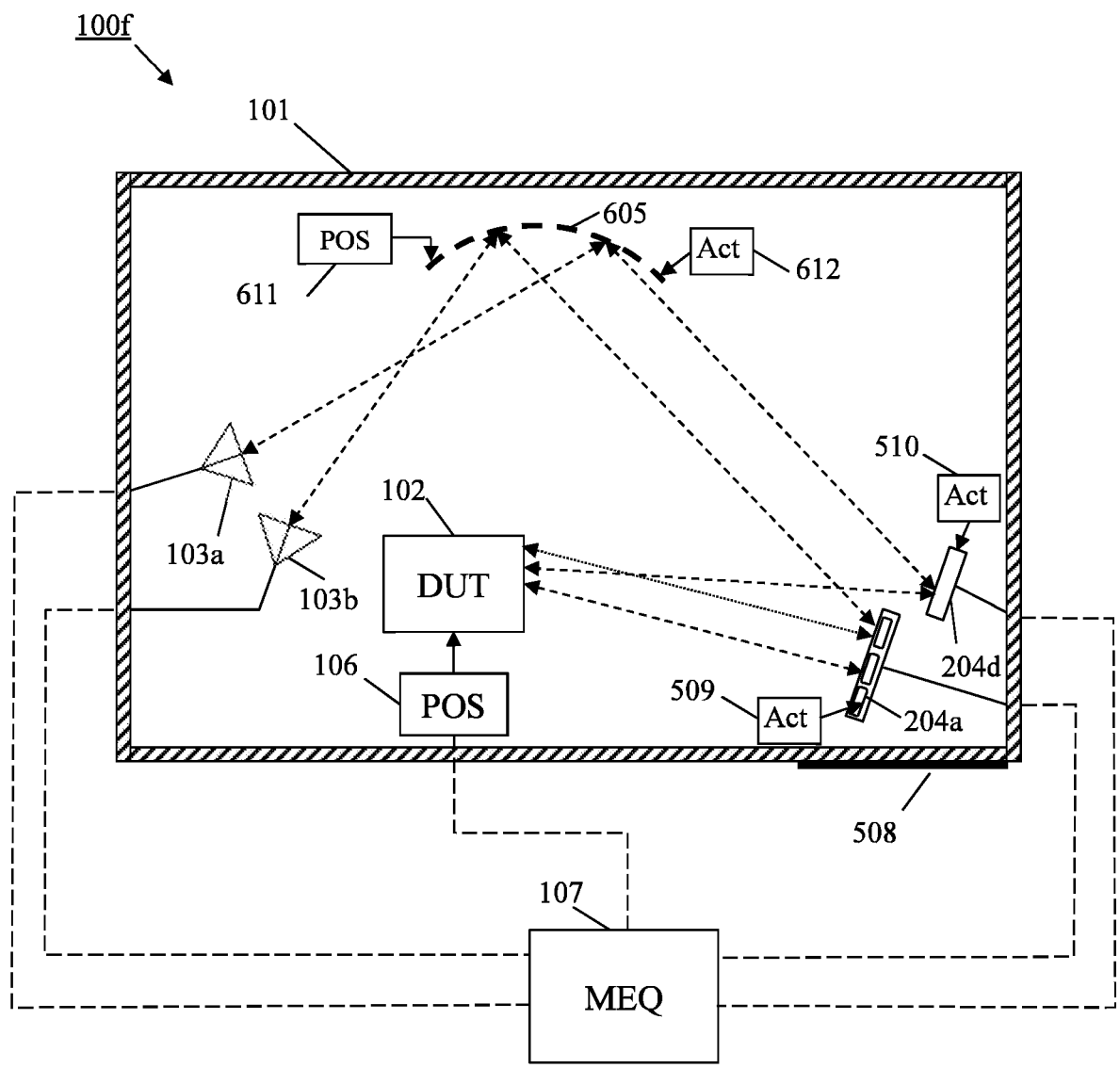
FIG. 6 shows a sixth embodiment of a measuring system for analyzing a DUT with several antennas, several mirrors and at least one shaped reflector, inside an anechoic chamber, in accordance with the present invention.

FIG. 6 illustrates a further embodiment of the inventive measurement system 100f, in which, by similarity to the reflected mirrors, the shaped reflector can be segmented, exemplarily reflector 605, in order to create further angles in the radiation that travels towards the reflected mirrors.

Moreover, the position of the shaped reflector 605 can be adjusted by using a positioner 611. In addition to this, the segments of the shaped reflector 605 can be tilted by employing at least one actuator 612.

Figure 7:
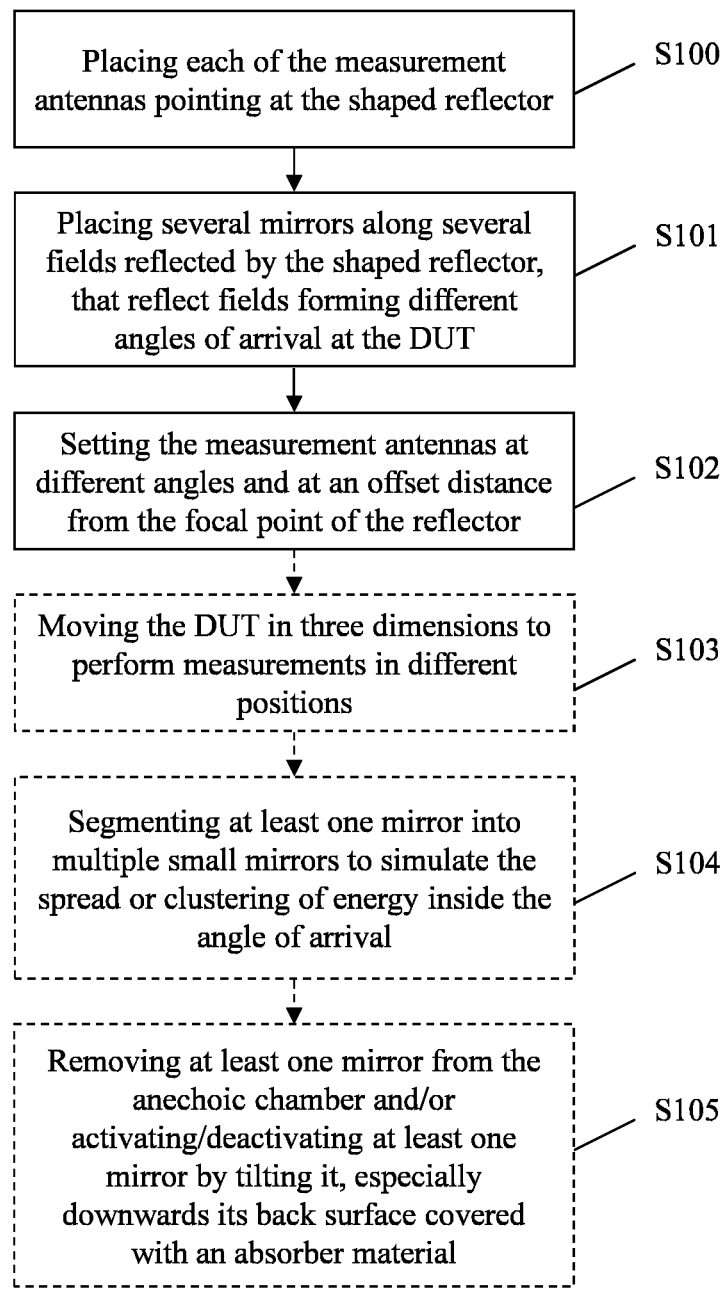
FIG. 7 shows a simplified block diagram of a representative embodiment of the measurement method in accordance with the present invention.

Now, a simplified block diagram of an embodiment of the inventive method is shown in FIG. 7. In a first step S100, several antennas are placed inside an anechoic chamber, pointing at a shaped reflector. In a second step S101, several mirrors are placed, also inside the anechoic chamber, along several fields reflected by the shaped reflector, wherein the mirrors reflect several fields that form different angles of arrival at a device under test.

The inventive method further comprises that each of the several measurement antennas is formed to be a feed antenna. In addition to this or as an alternative, the shaped reflector corresponds to a compact antenna test range reflector. Moreover, the anechoic chamber is formed as a shielded anechoic chamber which additionally or alternatively is formed as cuboid shaped.

Then, in a third step S102, the measurement antennas are set at different angles whereby the measurement antennas pointing at the shaped reflector are at an offset distance from the focal point of the shaped reflector. In addition to this or as an alternative, the field generated by each of the measurement antennas pointing at the reflector is arranged to be off center.

The inventive method further comprises the optional step S103 of moving the device under test in three dimensions, by using a positioner, to perform measurements in different positions. As a further, optional step S104, at least one of the mirrors, preferably each of the mirrors, is segmented into multiple small mirrors to simulate the spread or clustering of energy inside the angle of arrival.

Additionally, or as an alternative, the measurement method also comprises that some of the mirrors are formed to have different size, or alternatively are positioned at a different angles, to create different quiet zone sizes.

Additionally or alternatively, the measurement method also comprises that the several measurement antennas are formed to be part of an antenna array. In addition to this, the antenna array is configured to generate a number of M beams in multiple angles, wherein the number M of beams is greater than, or equal to, or smaller than the number N of measurement antennas.

Finally, the embodiment of the inventive measurement method comprises the optional step S105 of removing at least one of the mirrors, preferably each of the mirrors, from the anechoic chamber, manually or automatically, through an aperture arranged in one of the walls of the chamber. Additionally or alternatively, the method step comprises movably arranging at least one of the mirrors, preferably each of the mirrors, in the anechoic chamber in a way that the mirror is deactivated by being tilted, manually or automatically by a tilt mechanism, downwards its back surface, wherein the back surface of each of the mirrors is covered with an absorber material.

The characteristics of the exemplary embodiments can be used in any combination. The various components, structures and methods are included by way of illustration and example only and not in any limiting sense. Although the present invention and its advantages have been described in detail, it should be understood that various changes, substitutions and alterations can be made herein without departing from the scope of the invention defined by the appended claims.

What is claimed is:

1. A measurement system, for over the air multiple antenna measurements, comprising, inside an anechoic chamber:
    a device under test,
    two or more measurement antennas,
    two or more mirrors,
    at least one shaped reflector, and
    wherein the measurement antennas are placed pointing at the shaped reflector, and
    wherein each of the mirrors is placed along fields reflected by the shaped reflector, whereby the mirrors reflect fields that form different angles of arrival at the device under test.

2. The measurement system according to claim 1,
    wherein each of the measurement antennas is also a feed antenna, and/or
    wherein the shaped reflector corresponds to a compact antenna test range reflector.

3. The measurement system according to claim 1,
    wherein the anechoic chamber is a shielded anechoic chamber, and/or
    wherein the anechoic chamber is shaped as a cuboid.

4. The measurement system according to claim 1,
    wherein the measurement antennas are set at different angles whereby the measurement antennas pointing at the shaped reflector are at an offset distance from the focal point of the shaped reflector, and/or
    wherein the field generated by each of the measurement antennas pointing at the reflector is off center.

5. The measurement system according to claim 1,
    further comprising a device under test positioner configured to move the device under test in all three dimensions, in order to perform measurements in different positions.

6. The measurement system according to claim 1,
    wherein at least one of the mirrors, preferably each of the mirrors, is segmented into multiple small mirrors in order to simulate the spread or clustering of energy inside the angle of arrival at the device under test.

7. The measurement system according to claim 1,
    wherein the mirrors have different sizes, or alternatively are positioned at different angles, to create different quiet zone sizes.

8. The measurement system according to claim 1,
    wherein some of the mirrors are combined into a single mirror, whereby each section of the single mirror reflects a field creating multiple angles of arrival at the device under test.

9. The measurement system according to claim 1,
    wherein the measurement antennas are part of an antenna array,
    wherein the antenna array is configured to generate a number of M beams in multiple angles, wherein the number M of beams is greater than, or equal to, or smaller than the number N of measurement antennas.

10. The measurement system according to claim 1,
    wherein at least one of the mirrors, preferably each of the mirrors, is manually or automatically removable from the anechoic chamber through an aperture arranged in one of the walls of the chamber, and/or
    wherein at least one of the mirrors, preferably each of the mirrors, is movably arranged in the chamber in a way that the mirror is activated or deactivated by being tilted manually or automatically by a tilt mechanism, especially downwards its back surface wherein the back surface of each of the mirrors is covered with an absorber material.

11. A measurement method for over the air multiple antenna measurements, comprising the steps of:
- placing inside an anechoic chamber each of two or more measurement antennas pointing at a shaped reflector, and
- placing inside an anechoic chamber two or more mirrors along several fields reflected by the shaped reflector, wherein the mirrors reflect fields that form different angles of arrival at a device under test.

12. The method according to claim 11,
- wherein each of the two or more measurement antennas is formed to be also a feed antenna, and/or
- wherein the shaped reflector corresponds to a compact antenna test range reflector.

13. The method according to claim 11,
- wherein the anechoic chamber is formed as a shielded anechoic chamber and/or
- wherein the anechoic chamber is formed in a cuboid shape.

14. The method according to claim 11,
- further comprising setting the measurement antennas at different angles whereby the measurement antennas pointing at the shaped reflector are at an offset distance from the focal point of the shaped reflector, and/or
- wherein the field generated by each of the measurement antennas pointing at the reflector is arranged to be off center.

15. The method according to claim 11,
- further comprising the step of moving the device under test in all three dimensions by using a device under test positioner, in order to perform measurements in different positions.

16. The method according to claim 11,
- further comprising the step of segmenting at least one of the mirrors, preferably each of the mirrors, into multiple small mirrors to simulate the spread or clustering of energy inside the angle of arrival.

17. The method according to claim 11,
- wherein the mirrors are formed to have different sizes, or alternatively are positioned at different angles, to create different quiet zone sizes.

18. The method according to claim 11,
- wherein the mirrors are combined into a single mirror, whereby each section of the mirror reflects a field creating multiple angles of arrival at the device under test.

19. The method according to claim 11,
- wherein the measurement antennas are formed to be part of an antenna array, and
- wherein the antenna array is configured to generate a number of M beams in multiple angles, wherein the number M of beams is greater than, or equal to, or smaller than the number N of measurement antennas.

20. The method according to claim 11,
- further comprising the steps of:
  - removing at least one of the mirrors, preferably each of the mirrors, from the anechoic chamber, manually or automatically, through an aperture arranged in one of the walls of the chamber, and/or
  - movably arranging at least one of the mirrors, preferably each of the mirrors, in the anechoic chamber in a way that the mirror is deactivated by being tilted, manually or automatically by a tilt mechanism, downwards its back surface, wherein the back surface of each of the mirrors is covered with an absorber material.

\* \* \* \* \*